United States Patent [19]

Wyatt et al.

[11] 4,310,771
[45] * Jan. 12, 1982

[54] METHOD FOR TRANSFERRING POWER IN A SYNCHRONOUS MODE TO A MOTOR BUS

[75] Inventors: Michael A. Wyatt, Tampa; Robert W. Beckwith, Seminole, both of Fla.

[73] Assignee: Beckwith Electric Co., Inc., Largo, Fla.

[*] Notice: The portion of the term of this patent subsequent to Mar. 17, 1998, has been disclaimed.

[21] Appl. No.: 37,703

[22] Filed: May 10, 1979

Related U.S. Application Data

[63] Continuation-in-part of Ser. No. 37,680, May 10, 1979, Pat. No. 4,256,972.

[51] Int. Cl.³ .................. H02J 9/06; H02J 3/08
[52] U.S. Cl. .................. 307/64; 307/70; 307/87; 307/127; 324/83 R
[58] Field of Search .................. 307/64, 87, 127, 70, 307/23, 68; 364/492, 481, 484; 324/83 R; 315/86; 340/333

[56] References Cited

U.S. PATENT DOCUMENTS

| | | | |
|---|---|---|---|
| 2,838,685 | 6/1958 | Stineman | 307/87 |
| 3,226,561 | 12/1965 | Tanjai | 307/87 |
| 3,493,778 | 2/1970 | Cutler | 307/87 |
| 3,497,711 | 2/1970 | Wuttig | 307/87 |

*Primary Examiner*—Hix, L. T.
*Assistant Examiner*—S. D. Schreyer
*Attorney, Agent, or Firm*—Leo J. Aubel

[57] ABSTRACT

In a typical power system, a motor bus is fed by a main power system; and, an auxiliary system is provided to alternatively feed the motor bus. When a fast transfer from the main power to the auxiliary power system is desired, for example, in case of fault occurring in the main system, the inventive method transfers power in a synchronous mode; that is, power is transferred from the auxiliary system to the motor bus when the phase difference of the auxiliary system with respect to the frequency of the residual voltage on the motor bus is essentially zero degrees.

2 Claims, 3 Drawing Figures

METHOD FOR TRANSFERRING POWER IN A SYNCHRONOUS MODE TO A MOTOR BUS

This application is a continuation in part of Ser. No. 037,680, May 10, 1979, now U.S. Pat. No. 4,256,972.

BACKGROUND OF THE INVENTION

This application is related to the copending application entitled Synchronous Power Transfer Ser. No. 37,680 filed on May 10, 1979 now U.S. Pat. No. 4,256,972, in the names of Michael A. Wyatt and Robert W. Beckwith.

Changing electrical power system needs in the last decade have placed a more stringent demand for the rapid transfer of power to a motor bus having an inductive residual voltage thereon. For example, note FIG. 1 which shows a sketch of a typical power plant system 9. Under normal operating conditions circuit breaker 11 is closed, circuit breaker 12 is open, and accordingly power is supplied to the motor bus 15 through the main transformer 16. As is known, the auxiliary source or system 17 functions as a back-up or stand-by system. Under certain conditions, such as, for example, when a fault occurs in the main power source or system 18, such as between the generator 21 and the mainpower transformer 19, breaker 12 will open. In such event, it is desirable to electrically connect the motor bus 15 through the auxiliary transformer 20 to the auxiliary system 17 by closing breaker 14.

A fast transfer method is required to quickly establish the closing of breaker 14 to the auxiliary system 17. For example, in a nuclear plant, this auxiliary system must be connected or established within less than one second; otherwise, the plant will automatically shut down. In a coal fired plant, the time may even be shorter since slowing down of the forced draft fan can cause a boiler explosion due to the inertia of the air coming into the boiler.

Various methods are currently used for providing such transfer of power from the main system to the auxiliary system. One method has been to utilize two circuit breakers, one breaker coupling from the motor bus to the main source of power and the second breaker coupling from the motor bus to the auxiliary system. Closing of the second breaker is initiated, and the tripping or opening of the first breaker is accompanied by the same electrical contact. This requires the closing time of the second breaker to always be slower than the tripping time of the first breaker. If for some reason the foregoing does not occur in the exact time sequences stated, fault current can flow momentarily through the station service transformers resulting in the dramatic failure of the transformers.

A second method has been to initiate closing of a second breaker with a contact on the first breaker. However, in this method the transfer time may often be so long as to produce a worst case phase angle between the induced motor voltage and the new source. This can produce damaging stress on the motor shafts.

Another prior art method for closing the breaker 14 is a so-called residual voltage transfer. In this latter method, after the breaker 12 has opened, the voltage on the motor bus 15 is allowed to decay to a value of about 25% of the motor rated voltage, and then breaker 14 is closed. In starting up the plant, motors are started one, or a few, at a time. The auxiliary system 17 will generally be incapable of starting all the motors at once or even reaccelerating them after a short power interruption. The method of waiting for a 25% voltage level therefore requires selectively shutting down some nonessential motors in order to hopefully be able to reaccelerate critical motors. It is most difficult to assure the success of this method under the worst case combination of all the variables existing at the instant a transfer is initiated.

When breaker 12 is closed at zero degrees, it can be shown that all the inrush current goes to smoothly reaccelerating the motors and none is converted to potentially damaging shaft torque transients.

As shown in FIG. 2, the motor bus 15 residual voltage decay can be approximated as a straight line down to at least 25% value of motor rated voltage. The point $t_1$ and $t_2$ represent the time intervals for two different motor loads, of different characteristics, connected to the buses. It is important to note that the voltage decay rate is a function of the motor load characteristics, and accordingly, it becomes impractical to predict what the voltage decay rate will be at any time since the load combination on the motor bus is not known.

SUMMARY OF INVENTION

A method is disclosed in the present application for providing synchronous transfer of power to a motor bus from an auxiliary system; synchronous transfer may be defined as transferring power from an auxiliary system or source to the motor bus at a point in time such that the phase difference between the auxiliary system and the motor bus is nearly zero degrees. The transfer operation must be initiated before the phase difference between the auxiliary system and the motor bus is zero degrees to thereby compensate for the length of time the associated circuit breaker takes to close.

The foregoing features and advantages of the present invention will be apparent from the following more particular description of the invention. The accompanying drawings listed hereinbelow are useful in explaining and invention wherein:

DETAILED DESCRIPTION OF INVENTION

Figure 1:
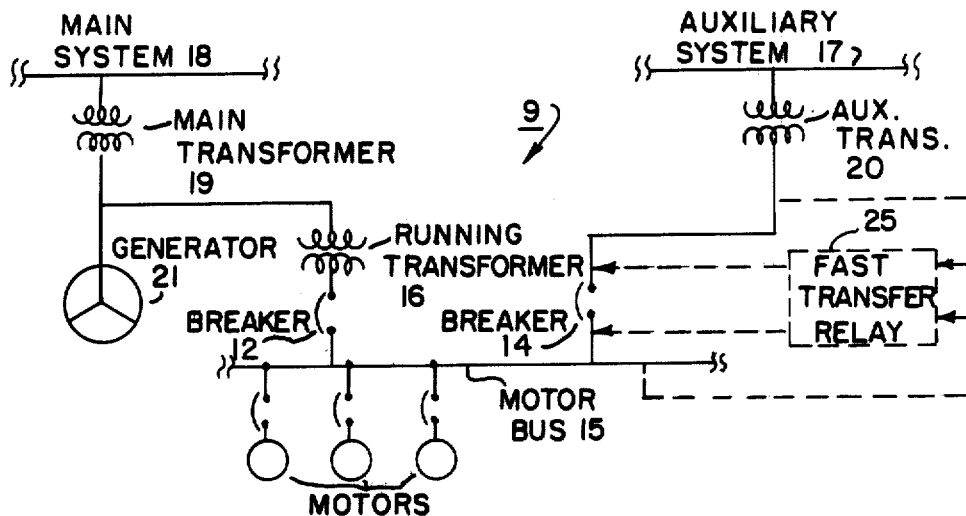
FIG. 1 shows a typical auxiliary system arrangement used in generating plants and shown in dotted lines a fast transfer relay which effects the method of the present invention.
Figure 2:
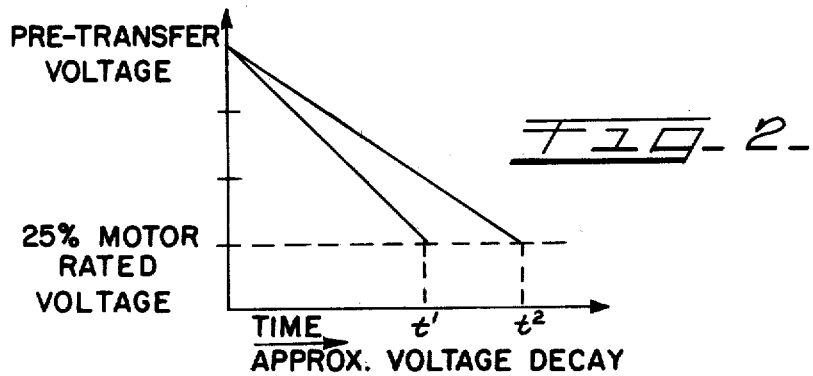
FIG. 2 is a graph showing the approximate voltage decay of the motor bus of FIG. 1 after breaker 14 is opened.

In considering the various methods of closing the circuit breakers, it has been found that some form of synchronism verification device should be included to prevent the new source from being connected out of phase. For this purpose, the dynamics of the auxiliary motor bus immediately following tripping of the normal supply breaker were examined. Studies indicated that when disconnected from a source of energy, rotating equipment will decelerate at a rate which is a function of the initial rotational inertia and the retarding torque. Considering that a typical motor bus has a combination of motor loads connected thereto, the deceleration of the total system becomes a complex function of the total system inertia, the time constants of the individual motor loads, the trapped flux in each machine, as well as the individual characteristics of each machine. As a result, the total motor bus may be viewed as an equivalent machine decelerating at a composite rate. The frequency of the residual voltage present on the motor bus during the deenergized transfer period will decay at a rate determined by a complex "average" of the spectrum of parameters associated with the "free-wheeling" motor bus. The system frequency will decay as the stored energy is dissipated by the load.

Upon re-energization by an auxiliary source, a still spinning motor connected to the motor bus may be damaged by the synchronizing torque associated with the phase angle between the residual and supply voltages. Synchronous machines are more susceptible to this type of damage than induction machines as the rotor of the synchronous machine must actually move thru this phase difference; while in the induction machines, this phase difference is partially accounted for by a shift in the air gap flux. The use of large synchronous motors in power plant applications has been somewhat limited by this phenomenon together with the relatively slow performance of previously available synchronizing equipments.

Thus, an important factor in selecting the method for accomplishing power transfer is the phase relationship between the power sources. In those situations where the phase relation between sources is a variable, a means of providing transfer only when the phase difference is minimal is required, otherwise an excessive and damaging voltage may be applied to the motor bus during the transfer.

Accordingly, in the present method, a principal parameter to be considered when providing a transfer of power from the auxiliary system 17 to the motor bus 15 is that at the point of power transfer, the phase difference between the frequency of the auxiliary system 17 and the frequency of the decaying voltage on the motor bus 15 should be essentially zero degrees.

As mentioned in the Summary of Invention, the present invention discloses a method for achieving a synchronous transfer of power from the auxiliary system 17 to the motor bus 15. Synchronous transfer may be defined as the transfer of power when the phase difference of frequency of the auxiliary system 17 with respect to the frequency of the inductive motor bus 15 is essentially zero degrees. Note, of course, that the time required for the circuit breaker 14 to close must be taken into account, hence breaker closure must be initiated at a time $t_a$, prior to the time $t_o$, when the phase difference between auxiliary system and the motor bus is essentially zero degrees, see FIG. 3.

The following analysis is useful in the understanding of the method of the present invention; and, more specifically, it is useful in determining the time when the circuit breaker should be closed to provide synchronous transfer of power from auxiliary system 17 to motor bus 15. As mentioned above, a useful concept in analyzing the present method is that the electrical voltage decay rate (after the circuit breaker 12 trips) of the motor bus 15 may be approximated as a linear function of time.

Basically, it has been found that the determination of the time when the breaker should be closed involves measuring the phase difference between the motor bus frequency and auxiliary system frequency; calculating the time derivative of the phase difference to obtain the rate of change of phase difference; calculating the second time derivative of the phase difference to obtain the rate of acceleration of phase difference; and, comparing these functions. When this is done, a prediction of zero phase difference is obtained; and, knowing the time required for a given breaker to close, a phase difference point can be calculated at which point it is desirable to initiate the closing of the breaker.

The measuring of phase difference between the bus and auxiliary potential inputs utilizes a method and means for detecting the zero crossings of the bus and auxiliary potentials to generate the phase difference information, as described in the above cited copending patent application of the same inventors.

Consider the following analysis:

If one assumes the electrical voltage of the motor bus, after being disconnected from power source by tripping the circuit breaker, will decay as a linear function of time, then the following equations express the frequency ($\omega$) and phase ($\Phi$) relations between the still-spinning motor bus ($\omega_{BUS}$), immediately after the breaker is opened, and the new source of power to be connected ($\omega_{LINE}$) thereto.

If $$\omega_{LINE} = 2\pi A$$

$$\omega_{BUS} = 2\pi(A + B + Ct)$$

then the difference in frequency is $$\begin{cases} \Delta W = W_{BUS} - W_{LINE} = 2\pi(B + 2Ct) = \Phi't \\ \Phi(t) = \int \Delta W = 2\pi(Bt + Ct^2 + D) \\ \Phi'' = 4\pi C = \Delta W' \end{cases} \quad (1)$$

where the constants A, B, C and D are functions of the rotating system.

If $t_o$ is defined as the time at which (t)=0 then from (1)

$$t_o = \frac{-B \pm \sqrt{B^2 - 4CD}}{2C} \quad (2)$$

By defining $T_B$ as the time required for the circuit breaker to close its contacts after being initiated, it is apparent the advance time $t_a$ follows the relation $$t_a + T_B = t_o \quad (3)$$

and $t_a$ is found to be a root of the homogenous differential equation:

$$\Phi(t) + T_B\Phi'(t) + KT_B\Phi''(t) = 0 \quad (4)$$

by substituting (1) into the above equation $$t_a = \frac{-(B + 2CT_B) \pm \sqrt{(B + 2CT_B)^2 - 4C(D + BT_B + 2KT_BC)}}{2C} \quad (5)$$

and from the relationships in equations (2) and (3), the constant K is determined to be:

$$K = \frac{T_B}{2} \quad (6)$$

Substituting this value into (4) simplifies the solution for $t_a$, $$t_a = \frac{-(B + 2CT_B) \pm \sqrt{B^2 - 4CD}}{2C} \quad (7)$$

which checks with the relation $t_a + T_B = t_o$, and the solution for $t_o$ in equation (2).

Figure 3:
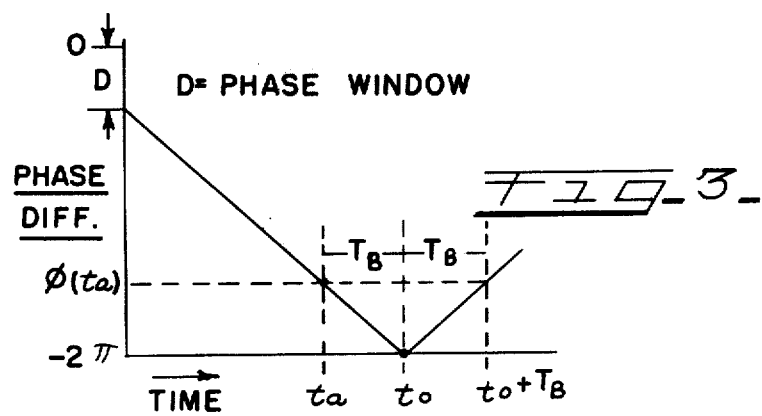
FIG. 3 is a graph showing the phase displacement relative to time.

The foregoing analysis and solution and the system dynamics is illustrated in FIG. 3.

Thus $t_a$ which is the point of the initiation of the breaker closure is always the breaker time $T_B$ period ahead or after time $t_o$. This is true regardless of system constants A, B, C, or D.

In view of the foregoing, if the phase difference between the motor bus and auxiliary power source changes slowly after disconnecting the motor bus from the main or original source, there is a phase window in which the circuit breaker can be closed; and secondly, this window will reappear after the time $t_a$.

The foregoing analysis verifies the applicability and accuracy of the synchronous mode of providing a fast transfer of power from a second system to a motor bus which has had an interruption of the power received from a first or main system.

While the invention has been particularly shown and described with reference to a preferred embodiment thereof, it will be understood by those skilled in the art, that various changes in form and details may be made therein without departing from the spirit and scope of the invention.

We claim:

1. A method for coupling power to a motor bus through a circuit breaker from an awxiliary power system which motor bus has a residual voltage thereon, said method consisting of the steps of:
   (a) sensing the frequency of the voltage of said auxiliary system;
   (b) sensing the frequency of the voltage of said motor bus;
   (c) measuring the phase difference between the voltage on the auxiliary system and the voltage on the motor bus;
   (d) obtaining the rate of change of the phase difference;
   (e) obtaining the phase difference acceleration;
   (f) comparing the phase difference, the rate of change of the phase difference and the phase difference acceleration to obtain a prediction of zero phase difference.

2. A method for providing synchronous transfer of power from a source to a motor bus by closing a circuit breaker connecting said source to said motor bus, which bus has a voltage varying in amplitude and frequency thereon, said method comprising the steps of:
   (a) sensing the frequency of the voltage of said source;
   (b) sensing the frequency of the varying voltage of said motor bus;
   (c) determining the phase difference, between the source voltage and the bus voltage;
   (d) determining the rate of change of phase difference;
   (e) determining the phase difference acceleration;
   (f) processing the phase difference, the rate of change of phase difference and the phase difference acceleration to determine the point at which there will be zero phase difference between the source frequency and the motor bus frequency;
   (g) providing an input representative of the time required for the associated circuit breaker to close; and
   (h) initiating the closing of the circuit breaker at a time point prior to the zero phase difference equal to the time required for the circuit breaker to close to thereby close the breaker at essentially zero phase difference.

* * * * *